United States Patent
Le Tiec et al.

(10) Patent No.: US 9,231,062 B2
(45) Date of Patent: Jan. 5, 2016

(54) METHOD FOR TREATING THE SURFACE OF A SILICON SUBSTRATE

(71) Applicant: COMMISSARIAT A L'ENERGIE ATOMIQUE ET AUX ENE ALT, Paris (FR)

(72) Inventors: Yannick Le Tiec, Crolles (FR); Laurent Grenouillet, Rives (FR); Maud Vinet, Rives (FR); Romain Wacquez, Marseilles (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 36 days.

(21) Appl. No.: 13/870,545

(22) Filed: Apr. 25, 2013

(65) Prior Publication Data
US 2013/0309449 A1 Nov. 21, 2013

(30) Foreign Application Priority Data

Apr. 27, 2012 (FR) .................................... 12 53893

(51) Int. Cl.
| | |
|---|---|
| H01L 21/302 | (2006.01) |
| H01L 29/34 | (2006.01) |
| H01L 21/02 | (2006.01) |
| H01L 21/306 | (2006.01) |
| H01L 31/0236 | (2006.01) |
| H01L 31/18 | (2006.01) |
| C09G 1/00 | (2006.01) |

(52) U.S. Cl.
CPC .......... H01L 29/34 (2013.01); H01L 21/02052 (2013.01); H01L 21/306 (2013.01); H01L 21/30604 (2013.01); H01L 31/02363 (2013.01); H01L 31/1804 (2013.01); C09G 1/00 (2013.01); *Y02E 10/547* (2013.01); *Y10T 428/24355* (2015.01)

(58) Field of Classification Search
CPC .................... H01L 21/31111; H01L 21/30604; H01L 21/30608; H01L 21/32139
USPC ............ 438/745, 747, 750, 751, 753; 216/83, 216/99, 103
See application file for complete search history.

(56) References Cited

U.S. PATENT DOCUMENTS

| | | | | |
|---|---|---|---|---|
| 5,308,400 | A | * | 5/1994 | Chen ................................. 134/2 |
| 6,132,522 | A | * | 10/2000 | Verhaverbeke et al. ......... 134/26 |
| 6,378,534 | B1 | * | 4/2002 | Olesen et al. .................. 134/1.3 |
| 2002/0052121 | A1 | * | 5/2002 | Lee et al. ....................... 438/745 |
| 2006/0115937 | A1 | * | 6/2006 | Barnett et al. ................. 438/151 |
| 2008/0166891 | A1 | * | 7/2008 | Hirasawa et al. .............. 438/795 |
| 2010/0093177 | A1 | | 4/2010 | Kozasa et al. | |

FOREIGN PATENT DOCUMENTS

| | | |
|---|---|---|
| EP | 1 480 265 A2 | 11/2004 |
| WO | WO 95/04372 | 2/1995 |
| WO | WO 2010/090978 A1 | 8/2010 |

OTHER PUBLICATIONS

French Preliminary Search Report issued Jan. 30, 2013, in French Application No. 12 53893 filed Apr. 27, 2012 (with English Translation of Categories of Cited Documents).

L. Grenouillet, et al., "Ellipsometry Measurements on Ultrathin Silicon on Insulator Films", IEEE International SOI Conference, Oct. 3-6, 2011, 2 pages.

M.M. Heyns, et al., "Cost-effective cleaning and high-quality thin gate oxides", IBM J. RES. Develop., vol. 43, No. 3, May 1999, 12 pages.

H.F. Okorn-Schmidt, "Characterization of silicon surface preparation processes for advanced gate dielectrics", IBM J. RES. Develop., vol. 43, No. 3, May 1999, 15 pages.

Zhanwen Xiao, et al., "Removal of Si(1 1 1) wafer surface etch pits generated in ammonia-peroxide clean step", Applied Surface Science Elsevier Netherlands, vol. 221, Jan. 15, 2004, 7 pages.

* cited by examiner

*Primary Examiner* — Lan Vinh
(74) *Attorney, Agent, or Firm* — Oblon, McClelland, Maier & Neustadt, L.L.P.

(57) ABSTRACT

The present invention relates to a method for chemically treating the surface condition of a silicon substrate for the roughness contrast characterized in that it comprises at least two successive treatment cycles, with each treatment cycle comprising a first step including placing in contact the silicon substrate with a first solution containing water diluted hydrofluoric (HF) acid and then a second step carried out at a temperature of less than 40° C., comprising placing in contact the silicon layer with a second solution containing water ($H_2O$) diluted ammonium hydroxide ($NH_4OH$) and hydrogen peroxide ($H_2O_2$), in order to obtain a roughness of less than 0.100 nanometer on a 1 μm×1 μm area upon completion of the treatment cycles.

The invention will be applied in the field of microelectronics for the production of transistors, of surfaces for photovoltaic panels or for direct molecular bonding.

20 Claims, No Drawings

METHOD FOR TREATING THE SURFACE OF A SILICON SUBSTRATE

TECHNICAL FIELD

The present invention relates to a method for treating the surface condition of a silicon substrate.

The invention will be applied in the field of micro-electronics for the production of transistors, of surface for photovoltaic panels or for direct molecular bonding.

STATE OF THE ART

The surfaces of Silicon-On-Insulator (SOI) sold for the production of transistors have characteristics predefined by the supplier.

To produce a transistor, various steps of treatment are carried out on such SOI surface: more particularly, forming thermal oxide and steps of etching and cleaning the gate oxide.

It is known to carry out a heat treatment on <<silicon-on-insulator>> which comprises a step of silicon epitaxy followed by hydrogen annealing, then by Argon annealing at 1,200° C. Such steps make it possible to supply a 12 nm SOI having a surface condition with a low roughness. The high cost of such method, which must be executed on a single wafer, has a deterrent effect on the industrial production of transistors.

The surface condition can also be treated by a hydrofluoric (HF) acid and ozone ($O_3$)-based chemical cleaning. The mixture is used in the field of photovoltaic panels, but the simultaneous control of $HF/O_3$ fluids is complex and hazardous.

Using ozone, which enables the formation of an oxide containing few metallic contaminants, is also known for cleaning the gate oxide. However, the formed oxide is thick, which is a constraint, since it contributes to a larger global insulation, such insulation taking two components into account: the oxide formed by the ozone step on the surface of the silicon substrate and the gate oxide of the thermal SiO2 or High k type processed in a step following the ozone step. The transistor performances are reduced: current is reduced because of the gate higher capacity and the insulator higher thickness.

A hot mixture of concentrated, low-dilution hydrogen peroxide ($H_2O_2$) and ammonium hydroxide ($NH_4OH$) is also used for removing or refining the gate oxide. The mixture is used hot, at a temperature above 60° C. Such technology is particularly bad for the surface condition, and even more particularly roughness.

Document WO 95/04372 discloses a method for reducing the number of surface particles of a semi-conductor. The document aims at cleaning the surface implementing steps of oxide growth and oxide partial removal, so as to maintain oxide on the surface at any time. Only particles of about 0.2 micrometers are removed. Cleaning uses a hot solution of hydrogen peroxide and ammonium hydroxide at a temperature of 80° C. Enhancing the roughness of a silicon surface is not the aim.

The article "Removal of Si (1 1 1) wafer surface etch pits generated in ammonia-peroxide clean-step" by Zhanwen Xiao et al. discloses a method for removing a crystal defect deliberately formed on the surface. The crystal defect is controlled as far as geometry is concerned. A hot solution of hydrogen peroxide and ammonium hydroxide at 70° C. is used. Cleaning efficiency is acknowledged but the solution is bad for roughness. Substituting sulphuric acid H2SO4 for ammonium hydroxide is preferred in the article, so as to reduce OH— concentration which would cause roughness degradation.

With these techniques, the surface condition is modified. This alteration results in:
- as regards electricity, the gate voltage variability is increased;
- as regards technology, the low scale thickness dispersion may be an obstacle to some technological steps, such as epitaxy. As a matter of fact, the quality of epitaxy locally depends on the initial thickness of silicon.

A need therefore exists for a method for treating the surface condition of a silicon substrate which remedies all or part of such drawbacks.

SUMMARY OF THE INVENTION

For this purpose, the present invention relates to a method for chemically treating the surface condition of a silicon substrate for controlling roughness, characterized in that it comprises at least two successive treatment cycles, with each treatment cycle comprising a first step comprising contacting the silicon substrate with a first solution containing water diluted hydrofluoric (HF) acid, then a second step, executed at a temperature of less than 40° C., comprising contacting the silicon substrate with a second solution containing water ($H_2O$) diluted ammonium hydroxide ($NH_4OH$) and hydrogen peroxide ($H_2O_2$).

Such steps both enable a removal of silicon, more precisely silicon dioxide, and oxidation. The balance between both effects during such successive steps and cycles improves the surface condition, more particularly roughness while performing a controlled removal.

Additionally, using a second solution at a temperature of less than 40° C. contributes to limiting etching and obtaining a satisfactory roughness although such solution is known in the state of the art as degrading the surface roughness. Using it at a temperature significantly lower than that discloses in the prior art surprisingly enabled to improve roughness in the present invention.

The invention more particularly improves micro-roughness to micrometer scale.

The chemical elements used during the treatment cycles are easily accessible and can be used without any complex condition.

The method according to the invention is easily implemented at a low cost.

According to cumulated or alternative variants, the method is such that:
- The RMS roughness upon completion of the treatment cycles is less than 0.100 nm and is obtained in a 1 µm×1 µm area; the successive treatment cycles are thus repeated until a RMS roughness of less than 0.100 nanometer is obtained in a 1 µm×1 µm area.
- the method comprises from 2 to 15 treatment cycles, preferably from 4 to 10 treatment cycles;
- the temperature of the second step ranges from 1 to 40° C., preferably from 5 to 25° C., and still preferably from 18 to 25° C.
- the temperature of the first step is lower than or equal to 40° C.;
- the temperature of the first step ranges from 1 to 40° C., preferably from 5 to 25° C., and still preferably from 18 to 25° C.
- the dilution of the solution used in the first step is from 5 to 2,000/1, preferably from 50 to 500/1, for 49% hydrofluoric (HF) acid by weight;

the first step is so configured as to remove from 0.2 to 100 nmn preferably from 0.5 to 5 nm of silicon oxide;

the duration of the first step ranges from 5 to 900 seconds, preferably from 20 to 300 seconds;

the volume ratio of the 28 to 30% ammonium hydroxide ($NH_4OH$) by weight to the 28 to 30% hydrogen peroxide ($H_2O_2$) by weight in the solution of the second step ranges from 1/10 to 10/1, preferably from 1/4 to 3/4;

the solution of the second step is diluted from 5 to 1000 times, preferably from 20 to 200 times;

the duration of the second step ranges from 10 seconds to 30 minutes, preferably from 30 seconds to 5 minutes;

the method comprises, after the at least two treatment cycles, a step of cleaning the surface intended for removing all metallic contamination;

the step of cleaning comprises contacting a cleaning solution containing water diluted hydrochloric acid (HCl) or a solution of water ($H_2O$) diluted 37% hydrochloric acid (HCl) by weight and 29% hydrogen peroxide ($H_2O_2$) by weight in a volume by of 1/1/5 to 1/1/100;

the first solution contains a mixture of hydrofluoric (HF) acid and ammonium fluoride ($NH_4F$) or ammonium hydroxide ($NH_4OH$);

the successive treatment cycles are repeated until a RMax roughness of less than 0.100 nanometer is obtained in a 1 µm×1 µm area.

The present invention also relates to a silicon substrate, the RMS roughness of which is of less than 0.100 nm in a 1 µm×1 µm area.

DESCRIPTION OF THE INVENTION

The present invention relates to a method for treating the surface condition of a silicon substrate.

The method according to the invention is a chemical treatment.

The method comprises at least two treatment cycles, each cycle comprises at least two steps.

The first step comprises placing in contact the silicon substrate with a first solution advantageously containing water diluted hydrofluoric (HF) acid.

The second step comprises placing in contact the silicon layer with a second solution advantageously containing water ($H_2O$) diluted ammonium hydroxide ($NH_4OH$) and water ($H_2O$) diluted hydrogen peroxide ($H_2O_2$).

The placing in contact preferably occurs on the substrate surface. The surface to be treated may be the planar surface of a transistor, or vertical flanks of a vertical transistor (Fin Fet), or oblique surfaces such as photovoltaic pyramids.

The first step mainly consists in etching the silicon oxide present on the surface of the silicon substrate. The removal of silicon oxide preferably varies from 0.5 to 5 nm.

The first solution comprising hydrofluoric (HF) acid is preferably produced from deionised water diluted 49% hydrofluoric (HF) acid by weight. Dilution ranges from 5 to 2,000, preferably from 50 to 500, and even more particularly is about 300.

The temperature of the steps, more particularly the first step and the second steps, preferably matches the temperature of the solutions used in these steps, respectively the first solution and the second solution.

The temperature of the first solution advantageously varies from 1 to 40° C., preferably from 10 to 30° C., preferably from 5 to 25° C., and is even more preferably the ambient temperature, i.e. from 18 to 25° C.

Dilution and the temperature of utilisation of the first solution reduce the etching time and thus enable a controlled removal.

For example, a solution of 49% hydrofluoric (HF) acid by weight diluted 300 times in deionised water, the temperature of which is 25° C. enables to remove 2 nm of silicon oxide for a contact duration of 2 minutes.

The contact duration of the first solution and the substrate is adapted for executing the desired removal of silicon oxide. The duration is advantageously 5 to 900 seconds, preferably 20 to 300 seconds.

According to one variant, the first solution comprises a mixture of hydrofluoric (HF) acid/ammonium fluoride ($NH_4F$) also called commercial BOE (Buffered Oxide Etching) or a mixture of hydrofluoric (HF) acid/ammonium hydroxide ($NH_4OH$) also called co-injected BOE. The last mixture corresponds to the HF/NH4F mixture when the acid-base reaction has occurred and when hydrofluoric (HF) acid is in excess.

Such mixtures are particularly useful when the silicon substrate is at least partially covered with a mask of resist. The mixtures are adapted as regards pH in order not to damage the resist while enabling satisfactory etching and removal of the silicon oxide.

The second step mainly consists in oxidation on the silicon substrate.

The second solution advantageously comprises ammonium hydroxide ($NH_4OH$) and hydrogen peroxide ($H_2O_2$) diluted in deionised water. Preferably, the second solution is produced from 28 to 30% ammonium hydroxide ($NH_4OH$) by weight and 28 to 30% peroxide hydrogen ($H_2O_2$) by weight.

Advantageously, the $NH_4OH/H_2O_2$ ratio ranges from 1/10 to 10/1. Preferably, the $NH_4OH/H_2O_2$ ratio ranges from 1/4 to 3/4. Ratio is by volume.

The dilution of the second solution ranges from 5 to 1,000, preferably from 20 to 200, more preferably by 100. The dilution factor is calculated with respect to the volume of ammonium hydroxide $NH_4OH$ introduced into the second solution.

According to the invention, the second solution has a temperature of less than 40° C., advantageously ranges from 1 to 40° C., preferably from 5 to 25° C., is more preferably the ambient temperature, from 18 to 25° C.

Using a solution at temperatures between 1 and 40° C. and advantageously rather low temperatures, i.e. lower than 25° C., preferably from 5 to 25° C., makes it possible to obtain a more homogeneous and improved surface condition.

The contact duration of the substrate with the second solution advantageously ranges from 20 seconds to 30 minutes, preferably from 1 minute to 20 minutes, and is more preferably 10 minutes.

Without building a theory, we can think that the second solution comprises chemical species which have very different effects, i.e. an etching effect and silicon oxidation effect.

The etching/oxidation balance more particularly depends on the temperature of the solution. At temperatures of less than 40° C., oxidation is the majority. The surface condition and more particularly roughness is not affected, it may even be improved.

The two steps of the method according to the invention are preferably executed in a sequence, without rinsing or intermediary step. The succession of the first step followed by the second step constitutes a treatment cycle. According to the invention, the method comprises at least two treatment cycles. Preferably, the number of cycles ranges from 4 to 15.

According to a first embodiment, the placing in contact of the silicon substrate with the first, and then the second solution is made by immersion into successive baths.

According to a second embodiment, the substrate is submitted to successive sprays while alternating the two solutions.

The surface condition of the silicon substrate is surprisingly significantly improved with the method according to the invention.

According to a possibility, after the at least two treatment cycles, the method comprises a cleaning step which places in contact the substrate with a solution of water diluted 37% specific volume hydrochloric acid (HCl). The dilution ranges from 5 to 1,000, preferably from 100 to 500, and is preferably 300.

The contact duration advantageously ranges from 20 seconds to 30 minutes, preferably 1 to 10 minutes, more preferably 5 minutes.

The solution is advantageously at a temperature ranging from 1° to 40° C., preferably at the ambient temperature between 18 and 25° C.

According to one variant, the solution of the cleaning step comprises a mixture of hydrochloric acid (HCl) and hydrogen peroxide ($H_2O_2$) diluted in deionised water. Preferably the volume ratio between the hydrochloric acid (HCl) and the hydrogen peroxide ($H_2O_2$) is 1/1. Dilution ranges from 5 to 100.

The hydrochloric acid (HCl) used is preferably a 37% one by weight and the hydrogen peroxide ($H_2O_2$) used is preferably a 29% one by weight.

The step of cleaning is intended for removing any metallic contamination.

Surface condition more generally means the layer roughness. To measure the roughness of a substrate, the suppliers generally use some standard convention and display such roughness on a 30×30 μm scan.

In the field of microelectronics, it is preferred to measure roughness on a micrometric scale (1 μm×1 μm) which corresponds to a sufficiently large local area as compared to the dimensions of the order of one nanometer of the devices produced. The micrometric scale makes it possible to obtain efficient information on roughness for the nanometric device properties. The 30 μm×30 μm scale gives information on a larger scale of the surface behaviour, for example oscillations, a recurrent network.

An atomic force microscope (AFM) can be used for measuring roughness.

Two types of measurements are made, i.e.:
RMS: Root Mean Square, also known under the reference Rq (root mean square height). It gives the root mean square of height discrepancies on the evaluated length and measured with respect to the average line.
RMax: Maximum Roughness. It gives the greatest distance between the highest point and the lowest point for the surface studied.

The selection of the number of cycles depends on the desired result for the substrate application.

For example, for thin film transistors, the RMax measure is selected to have a homogeneous roughness on the micrometric scale. For a treatment of the surface condition for a direct molecular bonding, RMS is rather selected on a 30×30 μm scale.

Using 4 treatment cycles makes it possible to reduce the thickness of a silicon substrate from 12 nm to 7 nm. The method enables a chemical thinning.

The invention is particularly interesting for photovoltaic pyramids. The present method can be used after the texturization and prior to the steps of deposition. The method makes it possible to round the apexes and the gaps of the pyramids while smoothing the oblique faces. A significant improvement of the condition of the interface between silicon and the deposited layers can be noted.

The method according to the invention may also be used for direct molecular bonding. It consists in stacking two structures on a small scale, for instance a local scale, bonding a chip on a wafer or a chip on another chip or, on a larger scale, bonding a wafer on a wafer.

This type of bonding implies at least one silicon surface the condition of which must be as smooth as possible. Using the present method makes it possible to improve the bonding time, upon the adhesion, to reinforce the bonding interface surface, to reduce the defectivity resulting from the bonding of two wafers.

The method according to the invention also enables a better growth of the layer, more particularly by epitaxy. Fewer stacking defects are noted. Here the RMax is concerned. In order to deposit a layer, the threshold is optimised since, for an average thickness of the layer of 3 nanometers, if the RMax roughness amounts to 2-4 nanometers, i.e. 2 nanometers, an epitaxy cannot be executed, whereas, for the same average thickness and a RMax roughness of 2.5-3.5, i.e. 1 nanometer, then the deposition is possible.

EXAMPLE

A method for treatment according to the invention has been used on a bulk silicon substrate with 1 to 10 treatment cycles.

I.e. each cycle comprises the spraying of solutions onto the surface of the substrate:

$1^{st}$ step: 2 minutes with a first solution of 49% hydrofluoric (HF) acid by weight at 25° C. 300 times diluted in deionized water then $2^{nd}$ step: 10 minutes with a second solution of 49% of ammonium hydroxide ($NH_4OH$) by weight and hydrogen peroxide ($H_2O_2$) diluted in deionized water. The ratio is 1/2 between the 29% ammonium hydroxide by weight and the 29% hydrogen peroxide by weight. Dilution is 100 times. The solution is at 25° C.

Upon completion of the two cycles, a step of cleaning is executed for 5 nm with a solution of 300 times diluted 37% specific volume hydrochloric acid (HCl) by weight at 25° C.

Each cycle removes about 1.2 nanometer of silicon. Roughness has been measured by AFM.

The results are given in the table hereinunder.

| TREATMENTS | RMS (Ang) | | RMax (Ang) | |
| --- | --- | --- | --- | --- |
| | 30 × 30 | 1 × 1 | 30 × 30 | 1 × 1 |
| initial | 1.11 | 1.65 | 10.9 | 18.2 |
| 4 cycles | 0.99 | 0.88 | 16.4 | 8.1 |
| 7 cyles | 1.05 | 0.99 | 11.0 | 9.0 |
| 10 cycles | 1.24 | 0.82 | 10.1 | 7.1 |

It can be noted that, as from four cycles, the RMax surface condition is significantly improved on a micrometric scale, and changes from a value of about 18 Ang to a value of less than 10 Ang. A reduction from about 1.65 Ang to less than 1 Ang in the RMS roughness on a micrometric scale can also be noted.

It can be noted too that up to 10 cycles, RMax and RMS values on a micrometric scale are even lower.

The invention claimed is:

1. A method for chemically treating a surface condition of a silicon substrate for controlling roughness, the method comprising from 2 to 15 successive treatment cycles, with each treatment cycle comprising:
   first contacting the silicon substrate with a first solution comprising water diluted hydrofluoric (HF) acid, then
   second, at a temperature of less than 40° C., contacting the silicon substrate with a second solution comprising water ($H_2O$) diluted ammonium hydroxide ($NH_4OH$) and hydrogen peroxide ($H_2O_2$),
   wherein each of the cycles includes the first and second contacting.

2. The method of claim 1, wherein the successive treatment cycles are repeated until a RMS roughness of less than 0.100 nanometer is obtained in a 1 μm×1 μm area.

3. The method of claim 1, wherein the temperature of the second contacting is from 18 to 25° C.

4. The method of claim 1, wherein a temperature of the first contacting is less than or equal to 40° C.

5. The method of claim 1, wherein a temperature of the first contacting is from 18 to 25° C.

6. The method of claim 1, wherein a dilution of the first solution is from 50 to 500/1, for 49% specific volume hydrofluoric (HF) acid.

7. The method of claim 1, wherein the silicon substrate in the first contacting comprises silicon oxide, and from 0.5 to 5 nanometers of the silicon oxide are removed during the first contacting.

8. The method of claim 1, wherein the first contacting is performed for 20 to 300 seconds.

9. The method of claim 1, wherein dilution of ammonium hydroxide in the second solution is from 5 to 1000 times.

10. The method of claim 1, wherein the second contacting is performed for 30 seconds to 5 minutes.

11. The method of claim 1, wherein the first solution comprises a mixture of hydrofluoric (HF) acid and ammonium fluoride ($NH_4F$) or ammonium hydroxide ($NH_4OH$).

12. A silicon substrate obtained by the method of claim 1, and having a RMS roughness of less than 0.100 nm in a 1 μm×1 μm area.

13. The method of claim 1, comprising from 4 to 10 treatment cycles.

14. The method of claim 1, wherein each treatment cycle consists of the first contacting and the second contacting the silicon substrate and at least one rinsing in between.

15. The method of claim 1, further comprising, after the 2 to 15 successive treatment cycles, cleaning the surface of the silicon substrate to remove all metallic contamination.

16. The method of claim 15, wherein the cleaning comprises contacting the silicon substrate with
   (i) a cleaning solution comprising water diluted hydrochloric acid, or
   (ii) a solution comprising water ($H_2O$) diluted hydrochloric acid (HCl) at 37% by weight and water diluted hydrogen peroxide ($H_2O_2$) at 29% by weight in a volume ratio of 1/1/5 to 1/1/100.

17. The method of claim 1, wherein a volume ratio of the ammonium hydroxide ($NH_4OH$) at 29% by weight to the hydrogen peroxide ($H_2O_2$) at 29% by weight in the second solution is from 1/10 to 10/1.

18. The method of claim 17, wherein the volume ratio is from 1/4 to 3/4.

19. A method for chemically treating a surface condition of a silicon substrate for controlling roughness, the method comprising at least two successive treatment cycles, with each treatment cycle comprising:
   first contacting the silicon substrate with a first solution comprising water diluted hydrofluoric (HF) acid, then
   second, at a temperature of less than 40° C., contacting the silicon substrate with a second solution comprising water ($H_2O$) diluted ammonium hydroxide ($NH_4OH$) and hydrogen peroxide ($H_2O_2$),
   wherein the successive treatment cycles are repeated until a RMS roughness of less than 0.100 nanometer is obtained in a 1 μm×1 μm area.

20. A method for chemically treating a surface condition of a silicon substrate for controlling roughness, the method comprising at least two successive treatment cycles, with each treatment cycle comprising:
   first contacting the silicon substrate with a first solution comprising water diluted hydrofluoric (HF) acid, then
   second, at a temperature of less than 40° C., contacting the silicon substrate with a second solution comprising water ($H_2O$) diluted ammonium hydroxide ($NH_4OH$) and hydrogen peroxide ($H_2O_2$),
   wherein the first solution comprises a mixture of hydrofluoric (HF) acid and ammonium fluoride ($NH_4F$) or ammonium hydroxide ($NH_4OH$).

* * * * *